(12) United States Patent
Ha

(10) Patent No.: US 10,005,190 B2
(45) Date of Patent: Jun. 26, 2018

(54) ROBOT WITH WRIST AND END EFFECTOR DIFFERENT MATERIALS

(71) Applicant: Persimmon Technologies, Corp., Wakefield, MA (US)

(72) Inventor: Tuan Ha, Randolph, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 389 days.

(21) Appl. No.: 14/956,678

(22) Filed: Dec. 2, 2015

(65) Prior Publication Data

US 2016/0158943 A1 Jun. 9, 2016

Related U.S. Application Data

(60) Provisional application No. 62/087,873, filed on Dec. 5, 2014.

(51) Int. Cl.
| | |
|---|---|
| *B25J 19/00* | (2006.01) |
| *B25J 9/00* | (2006.01) |
| *H01L 21/677* | (2006.01) |
| *H01L 21/687* | (2006.01) |

(52) U.S. Cl.
CPC ......... *B25J 19/0054* (2013.01); *B25J 9/0009* (2013.01); *H01L 21/67742* (2013.01); *H01L 21/68707* (2013.01); *Y10S 901/29* (2013.01); *Y10S 901/39* (2013.01)

(58) Field of Classification Search
CPC . B25J 19/00; B25J 19/0054; H01L 21/67742; H01L 21/68707
See application file for complete search history.

(56) References Cited

U.S. PATENT DOCUMENTS

| 8,716,909 B2 | 5/2014 | Hosek et al. | 310/64 |
| 2003/0012631 A1* | 1/2003 | Pencis | B25J 9/0009 414/744.5 |
| 2003/0014155 A1* | 1/2003 | Pencis | B25J 9/0009 700/213 |
| 2003/0014157 A1* | 1/2003 | Freeman | B25J 9/0009 700/218 |
| 2003/0094824 A1* | 5/2003 | Cox | B25B 5/08 294/104 |
| 2003/0202092 A1* | 10/2003 | Sadighi | B25J 9/1692 348/87 |

(Continued)

*Primary Examiner* — David M Fenstermacher
(74) *Attorney, Agent, or Firm* — Harrington & Smith

(57) ABSTRACT

An apparatus including a robot arm comprising a wrist, and an end effector. The wrist includes a frame member. The frame member includes a first material having a first coefficient of thermal expansion. The end effector is connected to the wrist at a connection. The end effector is configured to support a substrate thereon. The end effector includes a first member and a second member. At least one of the first and second members has a different second material with a different second coefficient of thermal expansion. The connection includes the first and second members being stationarily attached to each other with a portion of the frame member sandwiched therebetween. The connection is configured to substantially prevent the different respective coefficients of thermal expansion to deflect the end effector relative to the wrist when the end effector and wrist are heated and/or cooled.

18 Claims, 4 Drawing Sheets

(56) References Cited

U.S. PATENT DOCUMENTS

| | | | |
|---|---|---|---|
| 2009/0192522 A1* | 7/2009 | Blumenkranz | A61B 19/2203 606/130 |
| 2014/0205416 A1 | 7/2014 | Hosek et al. | 414/744.6 |
| 2016/0158943 A1* | 6/2016 | Ha | H01L 21/67742 74/490.06 |
| 2017/0018446 A1* | 1/2017 | Yin | H01L 21/68 |
| 2018/0019155 A1* | 1/2018 | Tsang | H01L 21/68707 |

* cited by examiner

ROBOT WITH WRIST AND END EFFECTOR DIFFERENT MATERIALS

CROSS REFERENCE TO RELATED APPLICATIONS

This application claims priority under 35 USC 119(e) on U.S. Provisional Application No. 62/087,873 filed Dec. 5, 2014, which is hereby incorporated by reference in its entirety.

BACKGROUND

Technical Field

The exemplary and non-limiting embodiments relate generally to a robot and, more particularly, to a joint between a wrist of a robot and an end effector.

Brief Description of Prior Developments

Vacuum robots are used in manufacture of semiconductor, flat panel and LED as well as other markets and applications. Load and capacity of payloads have increased for these robots over the years. Thus, demands on an arm of these robots, in terms of deflection, stiffness and weight, have increased over the years. By way of example, if the deflection of the arm is large, there must be additional height in valves, clearances in chambers and Z-direction stroke in the robot. This results in increased costs to manufacture the robots. One approach to increasing stiffness is by selecting higher stiffness materials to minimize deflection. By way of example, an aluminum arm may be made out of stainless steel. Here, the deflection is reduced, but the weight and cost of the arm are both increased resulting in the need for a higher torque producing robot drive to maintain the same motion profiles. This would increase costs. Accordingly, there is a desire to produce arms that have minimum deflection and weight to not need the added costs.

Another problem arises due to the temperature of the payload. A robot arm may deform due to thermal expansion. If the arm deforms in an unpredictable or non-uniform manner, there must be additional height in valves, clearances in chambers and Z-direction stroke in the robot. This would result in additional costs. Accordingly, there is a desire to produce arms that deforms, due to thermal effects, and expands and contracts in a uniform manner to not need the added costs.

SUMMARY

The following summary is merely intended to be exemplary. The summary is not intended to limit the scope of the claims.

In accordance with one aspect, an example embodiment is provided in an apparatus comprising a robot arm comprising a wrist, where the wrist comprises a frame member, where the frame member comprises a first material having a first coefficient of thermal expansion; and an end effector connected to the wrist at a connection, where the end effector is configured to support a substrate thereon, where the end effector comprises a first member and a second member, where at least one of the first and second members comprises a different second material having a different second coefficient of thermal expansion, where the connection comprises the first and second members being stationarily attached to each other with a portion of the frame member sandwiched therebetween, where the connection is configured to substantially prevent the different respective coefficients of thermal expansion to deflect the end effector relative to the wrist when the end effector and wrist are heated and/or cooled.

In accordance with another aspect, an example method comprises locating a portion of a frame member of a wrist of a robot arm between first and second members of an end effector, where the frame member comprises a first material having a first coefficient of thermal expansion, where the end effector is configured to support a substrate thereon, where at least one of the first and second members comprises a different second material having a different second coefficient of thermal expansion; and providing a connection of the end effector to the wrist, where the connection comprises the first and second members being stationarily attached to each other with a portion of the frame member sandwiched therebetween, where the connection is configured to substantially prevent the different respective coefficients of thermal expansion to deflect the end effector relative to the wrist when the end effector and wrist are heated and/or cooled.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
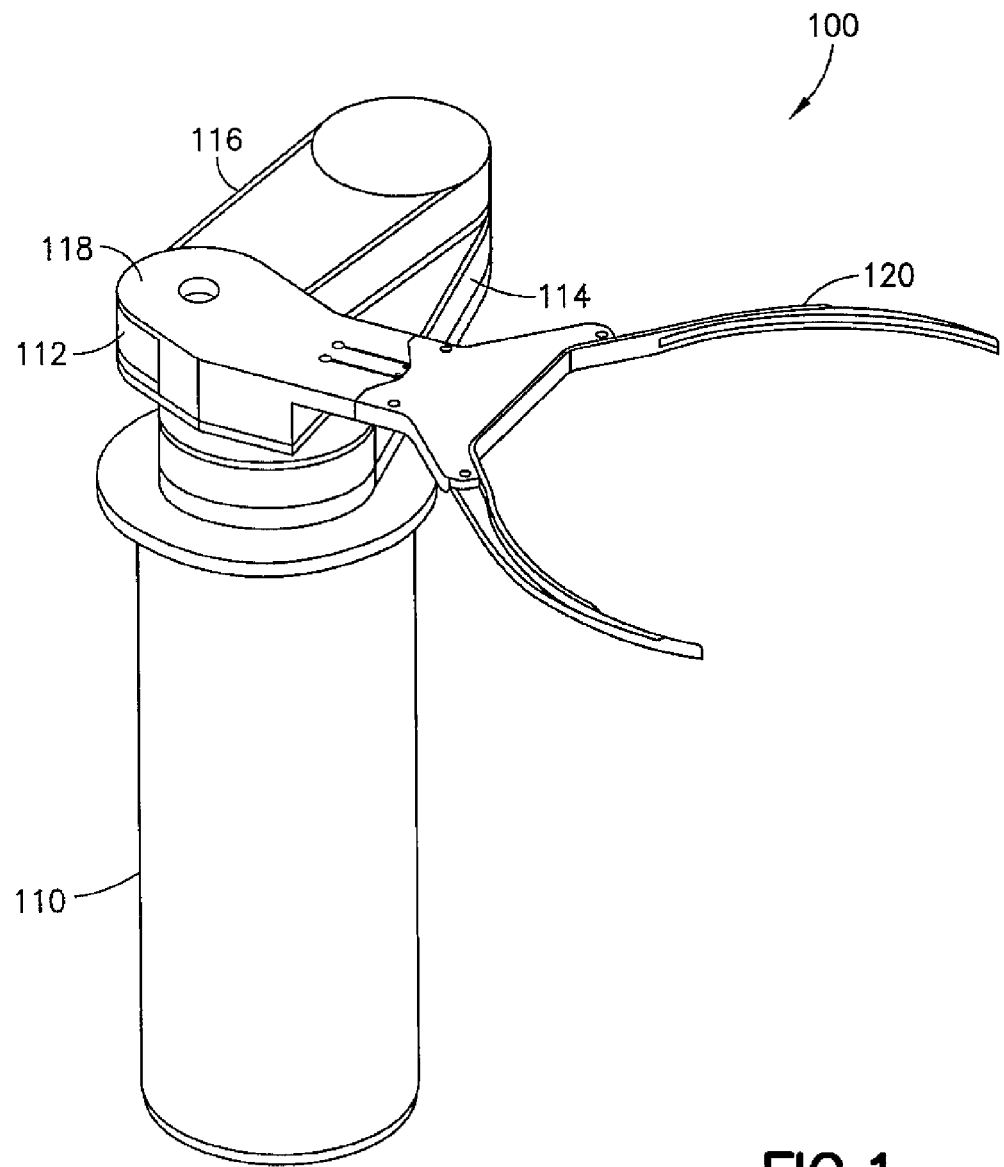
FIG. 1 is a perspective view of a robot incorporating features as described herein.

Referring to FIG. 1, there is shown a perspective view of a robot 100 incorporating features of an example embodiment. Although the features will be described with reference to the example embodiments shown in the drawings, it should be understood that features can be embodied in many alternate forms of embodiments. In addition, any suitable size, shape or type of elements or materials could be used.

The example robot 100 utilizes a wrist and end effector combination that may be made from different materials. However, the combination has been configured to provide a reduced deflection and weight, and reduced deformation due to thermal effects as well as to expand and contract in a uniform manner. FIG. 1 shows the robot 100 with a drive portion 110 and an arm portion 112. Drive portion 110 and arm portion 112 may have features as disclosed in U.S. Pat. No. 8,716,909 Issued May 6, 2014 and entitled "Robot With Heat Dissipating Stator" and may have features as disclosed in United States Publication No. US 2014/0205416 Published Jul. 24, 2014 and entitled "Robot Having Arm With Unequal Link Lengths" both of which are incorporated by reference herein in their entireties.

Figure 2:
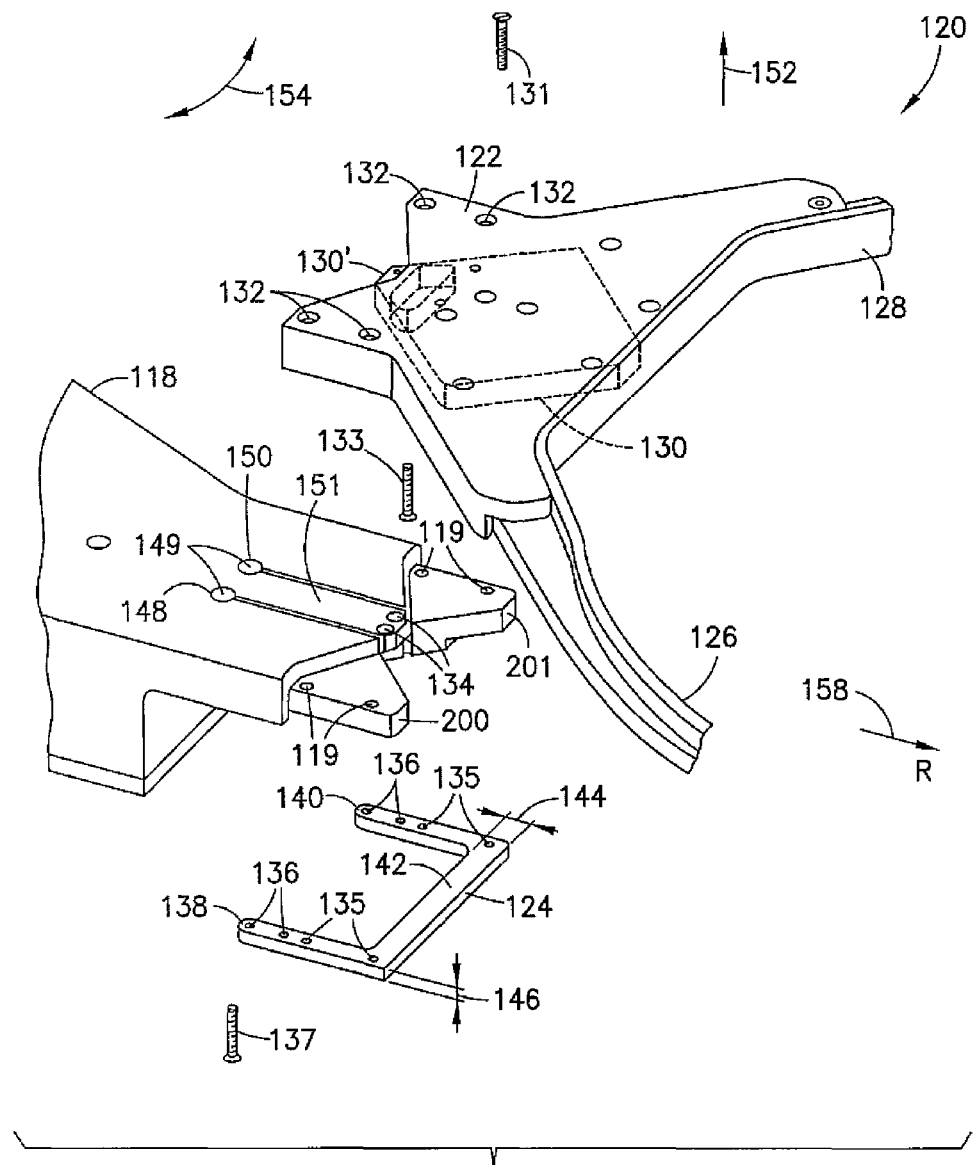
FIG. 2 is an enlarged, partial and exploded view of some of the components shown in FIG. 1.

The arm portion 112 has first and second links 114, 116 coupled to wrist 118. The wrist 118 is coupled to the end effector or end effector assembly 120. Referring also to FIG. 2 there is shown an exploded view of the wrist 118 and the end effector assembly 120. As will be described, in this example the wrist 118 and the end effector assembly 120 are composed of parts having different materials such that the assembly results in a composite materials assembly or alternately as a bi- or multi-metallic or other suitable material(s) assembly.

A difficulty with such assemblies arises when temperature changes or gradients are introduced to the assembly. For example, as different materials expand and contract at different rates, stresses may build up and cause deflection and deformation that would otherwise not be present if the assembly were to be made of a common material that expands and contracts at a uniform rate or amount. In the example shown, this problem is overcome by providing features and sizing/shaping the materials such that the composite assembly withstands changes in temperature without substantially deflecting in an adverse manner.

The wrist 118 may be machined as a single piece as shown or alternately may be assembled from multiple components. The end effector 120 is shown having an upper clamp plate 122 and a lower clamp plate 124 that are coupled to the wrist 118 as will be described. The end effector 120 further has first and second substrate supporting members 126, 128 rigidly coupled to a member mounting plate 130. The member mounting plate 130 may be rigidly, but adjustably, coupled to the upper clamp plate 122. The upper and lower clamp plates 122, 124 are coupled to the wrist 118 where, for example, four screws 131 (only one of which is shown) may extend through holes 132 from the upper plate 122 through holes 119 in the wrist 118 into holes 135 in the lower plate 122 to rigidly clamp the wrist 118 between the upper plate 122 and the lower plate 124. An additional two screws 133 (only one of which is shown) extend into holes 134 to couple the upper clamp plate 122 or member mounting plate 130 directly to the wrist 118. An additional four screws 137 (only one of which is shown) may further screw through holes 136 to rigidly connect extended portions 138, 140 of the lower plate 124 to the wrist 118 to control deflection. The screws or fasteners 131, 133, 137 may be sized and tightened in a manner such that as the temperature of the assembly changes, and portions expand at different rates, that there is no relative movement between the respective parts. In other words, such that a coefficient of friction is not overcome, or for example with pins that constrain the parts, to thereby prevent such relative movement at the interface between the parts.

A U-shaped bridge 142 of the lower plate 124 connects opposing sides of the lower plate together where the depth 144 and thickness 146 of the bridge may be provided to control deflection. The wrist 118 is shown further having first and second slots 148, 150 that have a bore 149 at their termination, for example, to reduce stress. The slots 148, 150 may be provided to control deflection and minimize internal stress when the parts are heated or cooled. In one example, the wrist 118 may be aluminum and the upper and lower clamp plates 124 may be made of stainless steel. Alternately any suitable combinations of materials may be provided. Where the wrist is aluminum and the clamp plates are stainless steel, the shapes, features, thicknesses, etc. cooperate such that, as the temperature of the assembly changes, the overall deflection of the assembly nets out to substantially zero and is essentially nulled out as compared to an assembly that has common materials with common coefficients of thermal expansion and converted into internal stresses within the assembly. Here the assembly may net to zero with one or more components at one or more locations, for example, at the center of the substrate.

As a first example of a problem which may be overcome, if the upper clamp plate 122 is directly coupled to the wrist 118 without the lower clamp plate 124, as the assembly heats up, the aluminum would expand more than the stainless steel due to its higher coefficient of thermal expansion. Were lower clamp plate 124 not provided with the features as described herein, then the upper clamp plate 122 would deflect up 152 and bow 154 as heat increases due to the difference in their respective coefficients of thermal expansion.

To overcome this problem, the slots 148, 150 have been added to the wrist 118 to relieve stress and strain due to the differences in thermal expansion, and the lower clamp plate 124 has been provided to cancel out the bimetallic effect that would cause the upper clamp plate 122 to otherwise deflect upward and bow. For example, the clamped and extended portions of the lower clamp plate may 124 be provided to cancel out the upward deflection 152 and the U-shaped portion 142 may be provided to cancel out the bow deflection 154.

The components (upper and lower clamp and portions of wrist) may be symmetric about a vertical plane that intersects or is offset from the radial axis 158 to further reduce deflection and bowing symmetrically. Alternately the components may be differently symmetric or not be symmetric. The features and shapes disclosed are merely exemplary and in alternate aspects, any suitable combination of shapes and materials may be provided. Providing fastening by screws is merely exemplary. In alternate aspects, any suitable fastening may be provided, for example, by pins or any suitable fastening and coupling technique.

Figure 3:
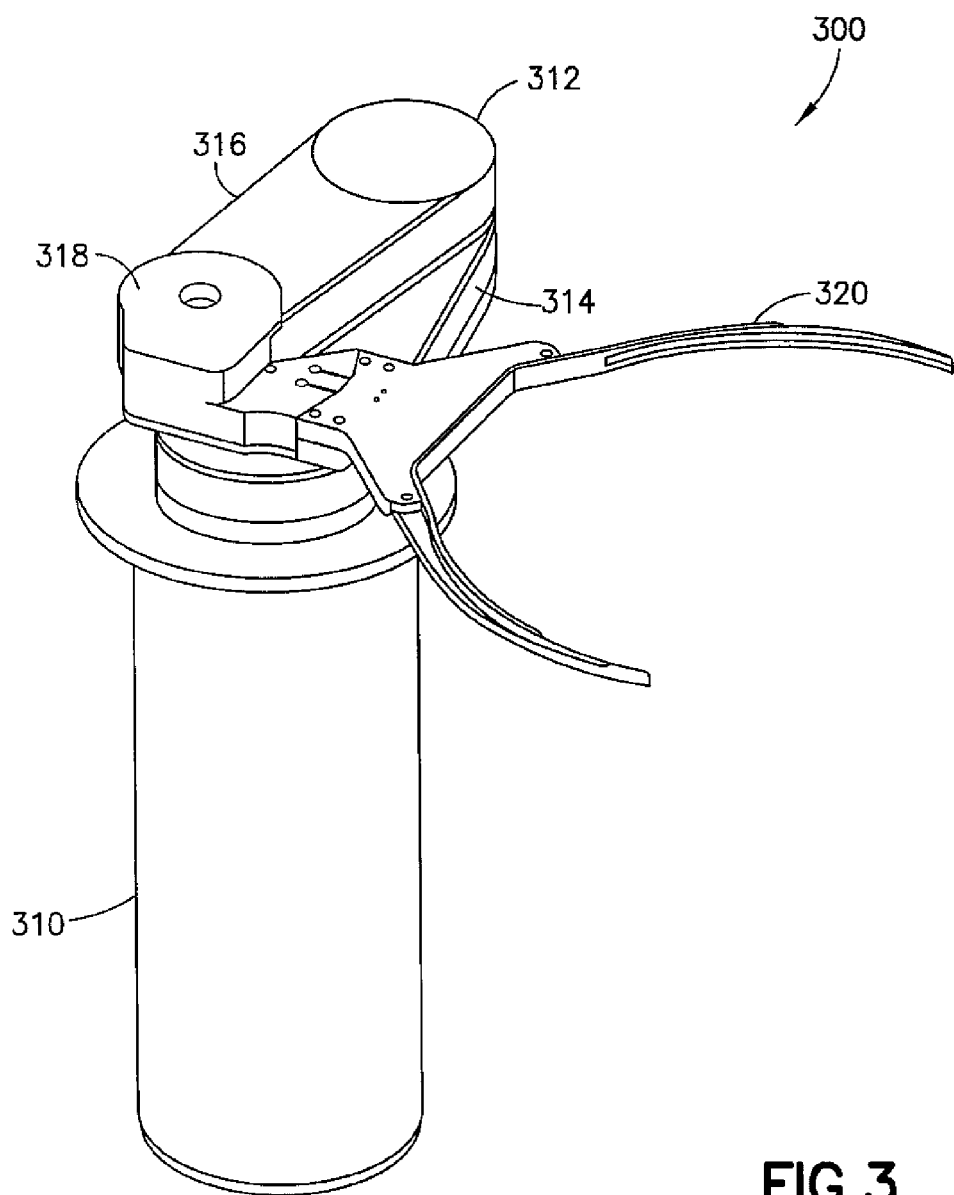
FIG. 3 is a perspective view of an alternate example embodiment.

Referring now to FIG. 3, there is shown robot 300 with drive portion 310 and arm portion 312. Drive portion 310 and arm portion 312 may have features as disclosed in U.S. Pat. No. 8,716,909 Issued May 6, 2014 and entitled "Robot With Heat Dissipating Stator" and may have features as disclosed in United States Publication No. US 2014/0205416 Published Jul. 24, 2014 and entitled "Robot Having Arm With Unequal Link Lengths" both of which are incorporated by reference herein in their entireties.

Figure 4:
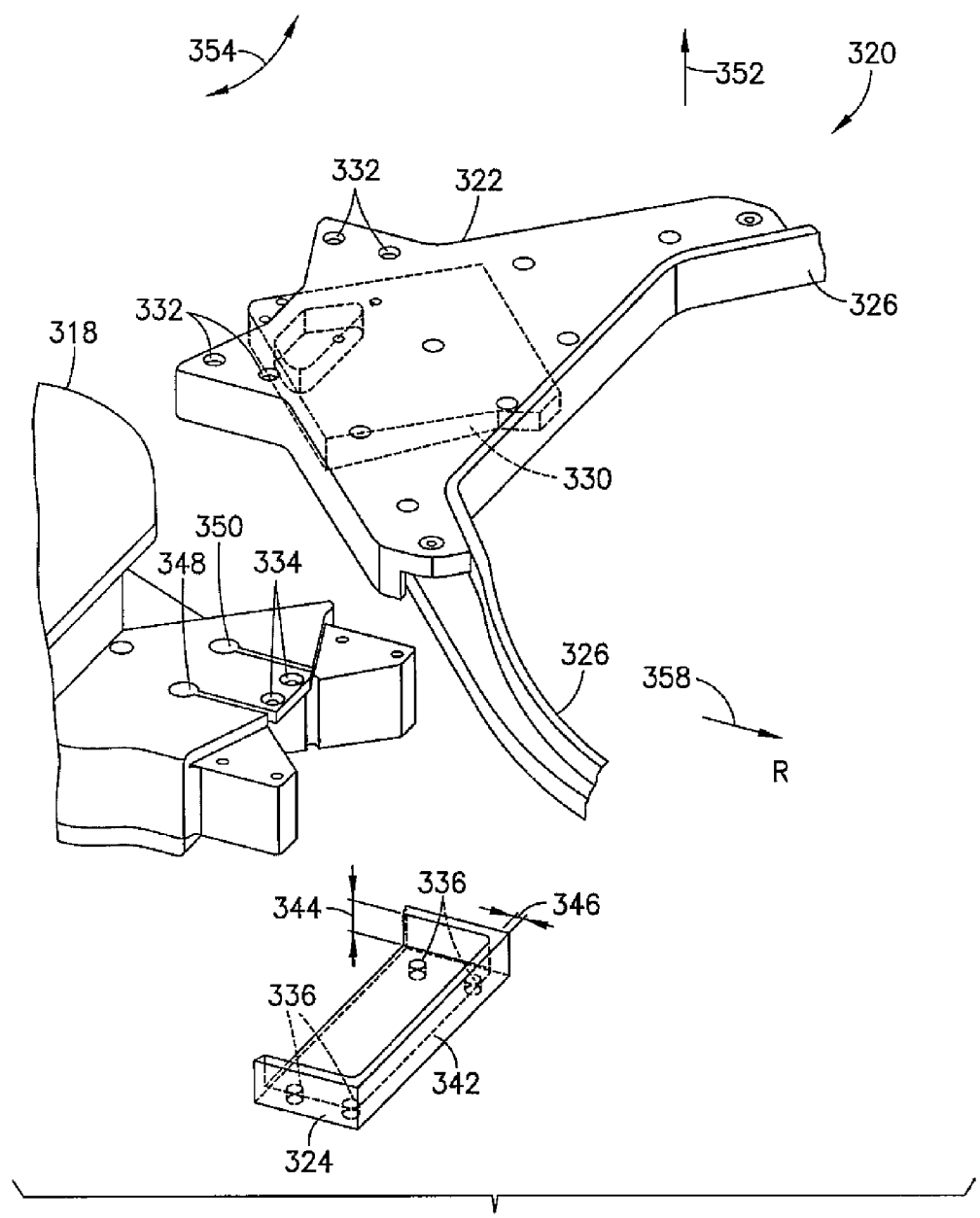
FIG. 4 is an enlarged, partial and exploded view of some of the components shown in FIG. 3.

The arm portion 312 has first and second links 314, 316 coupled to wrist 318 where wrist 318 is coupled to end effector 320. Referring also to FIG. 4 there is shown an exploded view of the wrist 318 and end effector 320 assembly. As will be described, the wrist 318 and end effector 320 assembly is composed of parts having different materials such that the assembly results in a composite materials assembly or alternately as a bi- or multi-metallic or other suitable material(s) assembly. A difficulty with such assemblies arises when temperature changes or gradients are introduced to the assembly. For example, as different materials expand and contract at different rates, stresses may build up and cause deflection and deformation that would otherwise not be present if the assembly were to be made of a common material that expands and contracts at a uniform rate or amount. In the present case, this problem is overcome by providing features and sizing/shaping the materials such that the composite assembly withstands changes in temperature without substantially deflecting in an adverse manner. The wrist 318 may be machined as a single piece as shown or alternately may be assembled from multiple components. The end effector is shown having upper clamp plate 322 and lower clamp plate 324 that are coupled to the wrist 318 as will be described. The end effector 320 further has first and second substrate supporting members 326, 328 rigidly coupled to member mounting plate 330 where member mounting plate 330 may be rigidly but adjustably coupled to upper clamp plate 322. The upper and lower clamp plates 322, 324 are coupled to the wrist 318 where, for example, four screws (not shown) may extend into holes 332 from the upper plate 322 into the wrist 318 to rigidly clamp the wrist 318 to the upper plate 322. An additional two screws (not shown) may extend into holes 334 to couple the upper clamp plate 322 directly to the wrist 318. An additional four screws (not shown) may extend through holes 336 from the lower plate 324 into the wrist 318 to rigidly clamp the wrist 318 to the lower plate 324 to control deflection. The screws or fasteners may be sized and tightened in a manner such that as the temperature of the assembly changes and portions expand at different rates that there is no relative movement between the respective parts, i.e. such that a coefficient of friction is not overcome or for example with pins that constrain the parts to prevent such relative movement at the interface between the parts. A L-shaped portion 342 connects opposing sides of the lower plate together where the depth 344 and thickness 346 of the portion may be provided to control deflection.

The wrist 318 is shown further having first and second slots 348, 350 that have a bore at their termination, for example, to reduce stress. The slots 348, 350 may be provided to control deflection and minimize internal stress when the parts are heated or cooled. In one example, the wrist may be aluminum and the upper and lower clamp plates may be made of stainless steel. Alternately any suitable combinations of materials may be provided. Where the wrist is aluminum and the clamp plates stainless steel, the shapes, features, thickness' and otherwise cooperate such that as the temperature of the assembly changes the overall deflection of the assembly nets out to substantially zero and is essentially nulled out as compared to an assembly that has common materials with common coefficients of thermal expansion and converted into internal stresses within the assembly. Here the assembly may net to zero with one or more components at one or more locations, for example, at the center of the substrate. As a first example, were the upper clamp plate 322 directly coupled to-the wrist 318 without the lower clamp plate 324, as the assembly heats up, the aluminum would expand more than the stainless steel due to its higher coefficient of thermal expansion. Were lower clamp plate 324 not provided with the features then the upper clamp plate 322 would deflect up 352 and bow 354 as heat increases due to the difference in their respective coefficients of thermal expansion. Here, the slots 348, 350 have been added to the wrist to relieve stress and strain due to the differences in thermal expansion and lower clamp plate 324 has been provided to cancel out the bimetallic effect that would cause the upper clamp plate 322 to otherwise deflect upward and bow. For example, the clamped and extended portions of the lower clamp plate may 324 be provided to cancel out the upward deflection 352 and the L-shaped portion 342 may be provided to cancel out the bow deflection. The components (upper and lower clamp and portions of wrist) may be symmetric about a vertical plane 352 that intersects or is offset from the radial axis 358 to further reduce deflection and bowing symmetrically. Alternately the components may be differently symmetric or not be symmetric. The features and shapes disclosed are merely exemplary and in alternate aspects, any suitable combination of shapes and materials may be provided. Providing fastening by screws is merely exemplary. In alternate aspects, any suitable fastening may be provided, for example, by pins or any suitable fastening and coupling technique.

An example apparatus may comprise a robot arm comprising a wrist, where the wrist comprises a frame member, where the frame member comprises a first material having a first coefficient of thermal expansion; and an end effector connected to the wrist at a connection, where the end effector is configured to support a substrate thereon, where the end effector comprises a first member and a second member, where at least one of the first and second members comprises a different second material having a different second coefficient of thermal expansion, where the connection comprises the first and second members being stationarily attached to each other with a portion of the frame member sandwiched therebetween, where the connection is configured to substantially prevent the different respective coefficients of thermal expansion to deflect the end effector relative to the wrist when the end effector and wrist are heated and/or cooled.

The first and second members may comprise an upper plate and a lower plate located against an upper surface and a lower surface of the portion of the frame member. The end effector may comprise a member mounting plate located under the upper plate which extends between arms of the portion of the frame member. The connection may comprise fasteners which extend between the first and second members, and through the portion of the frame member to stationarily attach the first and second members and the portion to one another. The second member may comprise a substantially flat plate with fastener mounting holes therethrough. The second member may comprise non-flat shaped plate having fastener mounting holes therethrough and at least one L-shaped portion. The portion may comprise two forward extending cantilevered side portions 200, 201 which are fixedly attached to the end effector by fasteners, and at least one slot 149, 150 extending rewardly into the frame member in an area generally between the two forward extending cantilevered side portions. A portion 130' of the upper plate 122 or member 130 may be located in the area between the cantilevered side portions 200, 201. The portion 130' may have fastener holes to receive the fasteners 133. Portion 130' would be located under the bridge 151 in this example. The at least one slot may comprise at least two parallel slots forming a bridge member therebetween, where a front end of the bridge member comprises a fastener hole therein, and a fastener connects the front end of the bridge member to a member mounting plate of the end effector. The apparatus may further comprise a drive portion connected to the robot arm.

An example method may comprise locating a portion of a frame member of a wrist of a robot arm between first and second members of an end effector, where the frame member comprises a first material having a first coefficient of thermal expansion, where the end effector is configured to support a substrate thereon, where at least one of the first and second members comprises a different second material having a different second coefficient of thermal expansion; and providing a connection of the end effector to the wrist, where the connection comprises the first and second members being stationarily attached to each other with a portion of the frame member sandwiched therebetween, where the connection is configured to substantially prevent the different respective coefficients of thermal expansion to deflect the end effector relative to the wrist when the end effector and wrist are heated and/or cooled.

The first and second members may comprise an upper plate and a lower plate, and where providing the connection may comprise locating the upper plate against an upper surface of the portion of the frame member and locating the lower plate against a lower surface of the portion of the frame member. Providing the connection may comprise a member mounting plate of the end effector, located under the upper plate, extending between arms of the portion of the frame member. The connection may comprise fasteners which extend between the first and second members, and the fasteners extend through the portion of the frame member to stationarily attach the first and second members and the portion to one another. The second member may comprise a substantially flat plate with fastener mounting holes therethrough. The second member may comprise non-flat shaped plate having fastener mounting holes therethrough and at least one L-shaped portion. The portion may comprise two forward extending cantilevered side portions which are fixedly attached to the end effector by fasteners, and at least one slot extending rewardly into the frame member in an area generally between the two forward extending cantilevered side portions. The at least one slot may comprise at least two parallel slots forming a bridge member therebetween, where a front end of the bridge member comprises a fastener hole therein, and a fastener connects the front end of the bridge member to a member mounting plate of the end effector. The method may further comprise connecting a drive portion to the robot arm.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
a robot arm comprising a wrist, where the wrist comprises a frame member, where the frame member comprises a first material having a first coefficient of thermal expansion; and
an end effector connected to the wrist at a connection, where the end effector is configured to support a substrate thereon, where the end effector comprises a first member and a second member, where at least one of the first and second members comprises a different second material having a different second coefficient of thermal expansion, where the connection comprises the first and second members being stationarily attached to each other with a portion of the frame member sandwiched therebetween, where the connection is configured to substantially prevent the different respective coefficients of thermal expansion to deflect the end effector relative to the wrist when the end effector and wrist are heated and/or cooled.

2. An apparatus as in claim 1 where the first and second members comprise an upper plate and a lower plate located against an upper surface and a lower surface of the portion of the frame member.

3. An apparatus as in claim 2 where the end effector comprises a member mounting plate located under the upper plate which extends between arms of the portion of the frame member.

4. An apparatus as in claim 1 where the connection comprises fasteners which extend between the first and second members, and through the portion of the frame member to stationarily attach the first and second members and the portion to one another.

5. An apparatus as in claim 1 where the second member comprises a substantially flat plate with fastener mounting holes therethrough.

6. An apparatus as in claim 1 where the second member comprises non-flat shaped plate having fastener mounting holes therethrough and at least one L-shaped portion.

7. An apparatus as in claim 1 where the portion comprises two forward extending cantilevered side portions which are fixedly attached to the end effector by fasteners, and at least one slot extending rewardly into the frame member in an area generally between the two forward extending cantilevered side portions.

8. An apparatus as in claim 7 where the at least one slot comprises at least two parallel slots forming a bridge member therebetween, where a front end of the bridge member comprises a fastener hole therein, and a fastener connects the front end of the bridge member to a member mounting plate of the end effector.

9. An apparatus as in claim 1 further comprising a drive portion connected to the robot arm.

10. A method comprising:
locating a portion of a frame member of a wrist of a robot arm between first and second members of an end effector, where the frame member comprises a first material having a first coefficient of thermal expansion, where the end effector is configured to support a substrate thereon, where at least one of the first and second members comprises a different second material having a different second coefficient of thermal expansion; and
providing a connection of the end effector to the wrist, where the connection comprises the first and second members being stationarily attached to each other with a portion of the frame member sandwiched therebetween, where the connection is configured to substantially prevent the different respective coefficients of thermal expansion to deflect the end effector relative to the wrist when the end effector and wrist are heated and/or cooled.

11. A method as in claim 10 where the first and second members comprise an upper plate and a lower plate, and where providing the connection comprises locating the upper plate against an upper surface of the portion of the frame member and locating the lower plate against a lower surface of the portion of the frame member.

12. A method as in claim 10 where providing the connection comprises a member mounting plate of the end effector, located under the upper plate, extending between arms of the portion of the frame member.

13. A method as in claim 10 where the connection comprises fasteners which extend between the first and second members, and the fasteners extend through the portion of the frame member to stationarily attach the first and second members and the portion to one another.

14. A method as in claim 10 where the second member comprises a substantially flat plate with fastener mounting holes therethrough.

15. A method as in claim 10 where the second member comprises non-flat shaped plate having fastener mounting holes therethrough and at least one L-shaped portion.

16. A method as in claim 10 where the portion comprises two forward extending cantilevered side portions which are fixedly attached to the end effector by fasteners, and at least one slot extending rewardly into the frame member in an area generally between the two forward extending cantilevered side portions.

17. A method as in claim 16 where the at least one slot comprises at least two parallel slots forming a bridge member therebetween, where a front end of the bridge member comprises a fastener hole therein, and a fastener connects the front end of the bridge member to a member mounting plate of the end effector.

18. A method as in claim 10 where further comprising connecting a drive portion to the robot arm.

* * * * *